United States Patent
Jung

(10) Patent No.: US 8,334,595 B2
(45) Date of Patent: Dec. 18, 2012

(54) SILICON CONTACTOR INCLUDING PLATE TYPE POWDERS FOR TESTING SEMICONDUCTOR DEVICE

(75) Inventor: Young Seok Jung, Seoul (KR)

(73) Assignee: ISC Technology Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/937,996

(22) PCT Filed: Apr. 7, 2009

(86) PCT No.: PCT/KR2009/001793
§ 371 (c)(1),
(2), (4) Date: Dec. 16, 2010

(87) PCT Pub. No.: WO2009/128619
PCT Pub. Date: Oct. 22, 2009

(65) Prior Publication Data
US 2011/0272803 A1    Nov. 10, 2011

(30) Foreign Application Priority Data
Apr. 15, 2008 (KR) .................. 10-2008-0034696

(51) Int. Cl.
*H01L 23/48* (2006.01)
(52) U.S. Cl. .............. 257/738; 257/48; 257/E23.021; 257/E23.069; 439/66; 439/83; 439/91
(58) Field of Classification Search ............ 257/48, 257/737, 738, E23.021, E23.069; 439/55, 439/66, 72, 83; 438/612–617
See application file for complete search history.

(56) References Cited

U.S. PATENT DOCUMENTS

| 6,422,879 B2 | 7/2002 | Fujimura |
| 7,267,559 B2 * | 9/2007 | Hashitani et al. ............... 439/91 |

FOREIGN PATENT DOCUMENTS

| KR | 1020050094478 A | 9/2005 |
| KR | 2020060062824 A | 6/2006 |

* cited by examiner

*Primary Examiner* — Jasmine Clark
(74) *Attorney, Agent, or Firm* — Ladas & Parry LLP

(57) ABSTRACT

A silicon contactor of which a side contacts test terminals of a semiconductor testing device and of which an other side contacts ball leads of a semiconductor device so as to be used in the semiconductor testing device, including: conductive silicon parts which are formed opposite to the ball leads and/or the test terminals and include silicon rubber and conductive powders; and an insulating silicon part which is formed by filling silicon rubber among areas of the conductive silicon parts, which do not contact the ball leads, and supports the conductive silicon parts, wherein the conductive powders of the conductive silicon parts include plate type powders. Therefore, the plate type powders are used as the conductive powders of the conductive silicon parts to improve contact characteristics between the conductive silicon parts and the semiconductor device.

6 Claims, 8 Drawing Sheets

SILICON CONTACTOR INCLUDING PLATE TYPE POWDERS FOR TESTING SEMICONDUCTOR DEVICE

CROSS-REFERENCE TO RELATED PATENT APPLICATION

This application claims the benefit of Korean Patent Application No. 10-2008-0034696, filed on Apr. 15, 2008, in the Korean Intellectual Property Office, the disclosure of which is incorporated herein in its entirety by reference.

BACKGROUND OF THE INVENTION

1. Field of the Invention

The present invention relates to a silicon contactor, and more particularly, to a silicon contactor of which a side contacts test terminals of a semiconductor testing device and of which an other side contacts ball leads of a semiconductor device in order to be used to test the semiconductor device and which includes conductive silicon parts electrically connecting the ball leads of the semiconductor device to the test terminals of the semiconductor testing device and an insulating silicon part supporting the conductive silicon parts.

2. Description of the Related Art

When processes of fabricating semiconductor devices are completed, a test for the semiconductor devices is to be performed. A testing device and a contactor are needed to perform the test for the semiconductor devices, wherein the contactor electrically connects the semiconductor devices to each other.

Among contactors, a silicon contactor has two characteristics: densely and electrically connecting semiconductor devices to each other without using an arbitrary means such as soldering, mechanical combinations, or the like; and absorbing mechanical impacts or modifications to flexibly connect the semiconductor devices to each other. Thus, the silicon contactor has been widely used as a contactor of a semiconductor testing device.

FIG. 1 is a cross-sectional view illustrating a conventional silicon contactor 100, and FIG. 2 is a cross-sectional view illustrating a ball lead 170 of FIG. 1 and a conductive silicon part 110 of FIG. 1 contacting the ball lead 170.

The conventional silicon contactor 100 includes the conductive silicon parts 110 which contact the ball leads 170 of a ball grid array (BGA) semiconductor device 160 and an insulating silicon part 130 which operates as an insulating layer between the conductive silicon parts 110.

Upper and lower surfaces of the conductive silicon parts 110 respectively contact the ball leads 170 of the BGA semiconductor device 160 and test terminals 150 of a semiconductor testing device 140 to electrically connect the ball leads 170 to the test terminals 150.

The conductive silicon parts 110 are formed by mixing conductive powders 120 with silicon and then hardening the mixture and operate as conductors for conducting electricity. The conductive powders 120 have ball or sphere shapes.

Referring to FIG. 2, the conductive silicon part 110 of the conventional silicon contactor 100 is pressed up and down to improve a contact characteristic when the conventional silicon contactor 100 contacts the BGA semiconductor device 160 and the semiconductor testing device 140 to test the BGA semiconductor device 160. When the conductive silicon part 110 is pressed, the upper conductive powders 120 are pushed down, and middle conductive powders 120 are pushed aside little by little.

The conductive powders 120 used in the conductive silicon parts 110 of the conventional silicon contactor 100 have structures in which small ball type powders are fixed by silicon rubber. Therefore, after a lot of semiconductor tests are performed, the conductive powders 120 come out of or are sunk into the conductive silicon parts 110, thereby lowering electric and mechanical characteristics of the conventional silicon contactor 100.

Also, since the ball leads 170 come into surface-contacts with the conductive powders 120, foreign substances stick to areas in which the ball leads 170 contact the conductive silicon parts 110. Therefore, the electrical characteristic of the conventional silicon contactor 100 is lowered or an electrical connection of the conventional silicon contactor 100 is cut.

SUMMARY OF THE INVENTION

The present invention provides a silicon contactor using plate type powders to form conductive silicon parts so as to prevent conductive powders from being sunk into or coming out of the conductive silicon parts.

The present invention also provides a silicon contactor using plate type powders to allow conductive silicon parts to come into line-contacts with ball leads of a semiconductor device so as to improve a contact pressure.

According to an aspect of the present invention, there is provided a silicon contactor of which a side contacts test terminals of a semiconductor testing device and of which an other side contacts ball leads of a semiconductor device so as to be used in the semiconductor testing device, including: conductive silicon parts which are formed opposite to the ball leads and/or the test terminals and include silicon rubber and conductive powders; and an insulating silicon part which is formed by filling silicon rubber among areas of the conductive silicon parts, which do not contact the ball leads, and supports the conductive silicon parts, wherein the conductive powders of the conductive silicon parts include plate type powders.

Circumferential surfaces of the plate type powders contacting the ball leads may be erect to contact the ball leads.

Circumferential surfaces of the plate type powders contacting the test terminals may be erect to contact the test terminals.

Wide surfaces of the plate type powders may have circular shapes, elliptical shapes, or polygonal shapes.

The conductive powders may further include ball type powders.

The conductive silicon parts may protrude more than the insulating silicon part.

Parts of bodies of the conductive powders contacting the ball leads and/or the test terminals may be exposed outside the silicon rubber.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
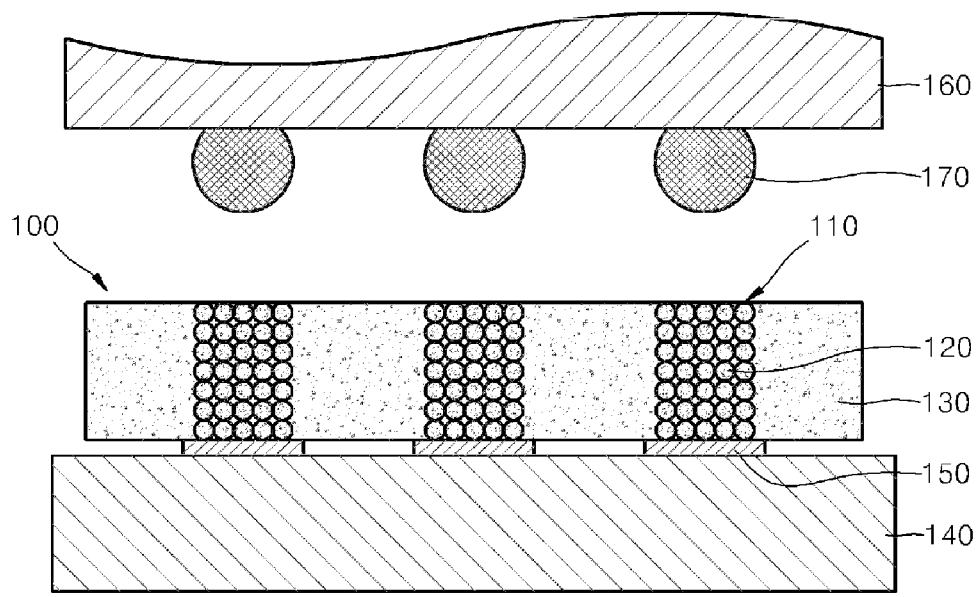
FIG. 1 is a cross-sectional view illustrating a conventional silicon contactor.
Figure 2:
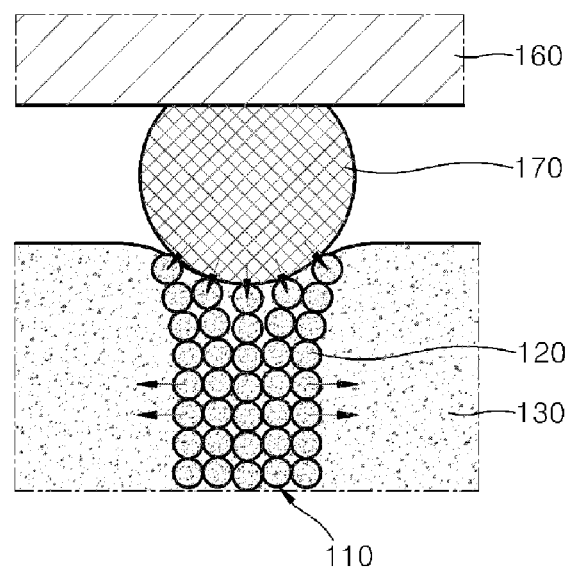
FIG. 2 is a cross-sectional view illustrating ball leads of FIG. 1 and a conductive silicon part of FIG. 1 contacting the ball leads.

The present invention will now be described more fully with reference to the accompanying drawings, in which exemplary embodiments of the invention are shown. Like reference numerals in the drawings denote like elements.

Figure 3:
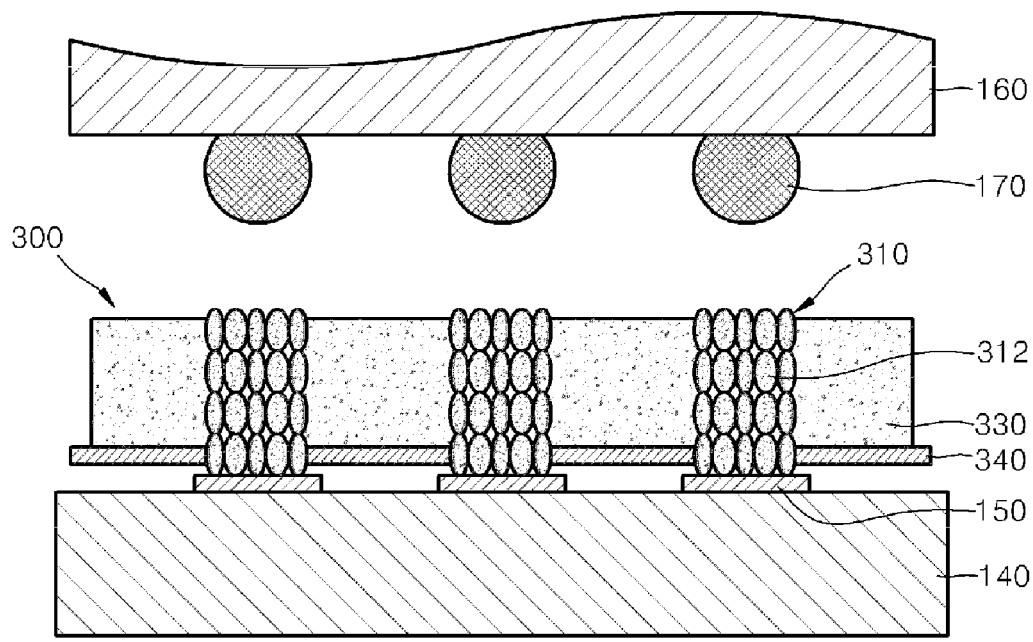
FIG. 3 is a cross-sectional view illustrating a silicon contactor according to an embodiment of the present invention.

FIG. 3 is a cross-sectional view illustrating a silicon contactor 300 according to an embodiment of the present invention. The silicon contactor 300 of the present embodiment includes conductive silicon parts 310 and an insulating silicon part 330. The silicon contactor 300 includes a side (a lower end) which contacts test terminals 150 of a semiconductor testing device 140 and an other side (an upper end) which contacts ball leads 170 of a semiconductor device 160, so as to be used to test the semiconductor device 160.

The conductive silicon parts 310 are formed in a vertical direction in areas opposite to the ball leads 170 of the semiconductor device 160 and the test terminals 150 of the semiconductor testing device 140. The conductive silicon parts 310 also include conductive powders 312 and silicon rubber (not shown).

Here, the conductive powders 312 include plate type powders but may further include ball type powders which are used in conventional conductive silicon parts. The conductive powders 312 are densely filled into the silicon rubber so that the conductive silicon parts 310 conducts electricity. The conductive silicon parts 310 electrically connect the ball leads 170 of the semiconductor device 160 to the test terminals 150 of the semiconductor testing device 140, wherein the ball leads 170 are to contact upper ends of the conductive silicon parts 310, and the test terminals 150 are to contact lower ends of the conductive silicon parts 310.

As shown in FIG. 3, the plate type powders 312, which contact the ball leads 170 of the semiconductor device 160, are erect so that their circumferential surfaces (thickness parts) contact the ball leads 170 of the semiconductor device 160. The plate type powders 312, which contact the test terminals 150 of the semiconductor testing device 140, are erect so that their circumferential surfaces contact the test terminals 150.

The erect type means that wide surfaces of the plate type powders 312 are approximately vertical to an upper or lower surface of the silicon contactor 300, but the plate type powders 312 are not limited to the erect type. The plate type powders 312 may be slantingly erect. In other words, since the circumferential surfaces of the plate type powders 312 have only to come into line-contacts with the ball leads 170 or the test terminals 150, the wide surfaces of the plate type powders 312 have only not to be parallel with the upper or lower surface of the silicon contactor 300. Differently from conventional ball type powders, the plate type powders 312, which are erect as described above, come into the line-contacts with the ball leads 170 or the test terminals 150. The plate type powders 312 improve contact pressures between the plate type powders 312 and the ball leads 170 and/or between the plate type powders 312 and the test terminals 150 in order to improve contact characteristics.

The plate type powders 312 have plate shapes, i.e., wide and thin plate shapes. The wide surfaces of the plate type powders 312 may have circular shapes, elliptical shapes, or polygonal shapes but are not limited thereto. Ball type powders may be compressed to form the plate type powders 312. In this case, the plate type powders 312 may be processed in circular, elliptical, or irregular shapes. The plate type powders 312 come into the line-contacts with the ball leads 170 and/or the test terminals 150 to improve the contact pressures. Thus, the plate type powders 312 may be formed in any shapes which enable line-contacts.

Since the wide surfaces of the plate type powders 312 contact the silicon rubber, the plate type powders 312 do not easily come out of the silicon rubber after repeated semiconductor tests are performed, differently from the conventional ball type powders. Also, if the plate type powders 312 are erect, the plate type powders 312 do not further come out of the silicon rubber.

Parts of bodies of the plate type powders 312, which contact the ball leads 170 and/or the test terminals 150, may be exposed outside the silicon rubber. In other words, the plate type powders 312 allow the ball leads 170 and/or the test terminals 150 not to directly contact the silicon rubber in order to prevent the silicon rubber from being damaged. Since the plate type powders 312 directly contact the ball leads 170 and/or the test terminals 150, electric contact characteristics are improved, and the silicon rubber is prevented from being damaged, thereby preventing the plate type powders 312 from easily coming out of the silicon rubber.

As will be described later, the conductive silicon parts 310 may protrude more than the insulating silicon part 330 to improve the contact characteristics but do not need to necessarily protrude.

The conductive powders 312 may be formed of a single conductive metal material, such as iron (Fe), copper (Cu), zinc (Zn), chrome (Cr), nickel (Ni), silver (Ag), cobalt (Co), aluminum (Al), or a conductive metal alloy formed of two or more combinations of them. Among these metal materials, the conductive powders 312 may be formed of a single conductive metal material such as nickel (Ni), Fe, Cu in consideration of economical and conductive aspects. In particular, the conductive powders 312 may be formed of a Ni material of which surface is coated with gold. A method of coating the surface of the Ni material is not limited, but the surface of the Ni material may be coated using chemical plating or electroplating.

The silicon rubber absorbs the contact pressures generated when the ball leads 170 and/or the test terminals 150 contact the conductive silicon parts 310, so as to protect the ball leads 170 and/or the test terminals 150. The silicon rubber also has elasticity and thus easily help the ball leads 170 and/or the test terminals 150 to contact the conductive silicon parts 310 even if the ball leads 170 and/or the test terminals 150 are not horizontal to the conductive silicon parts 310.

Silicon rubber (an insulator) is filled into areas of the conductive silicon parts 310, which do not contact the ball leads 170 of the semiconductor device 160 and/or the test terminals 150 of the semiconductor testing device 140, to form the insulating silicon part 330. Thus, the insulating silicon part 330 insulates the conductive silicon parts 310 from one another. The insulating silicon part 330 also supports the conductive silicon parts 310. The silicon rubber of the insulating silicon part 330 is filled among the conductive silicon parts 310 to stabilize an entire position of the silicon contactor 300. The silicon rubber also supports the conductive silicon parts 310 so that the conductive silicon parts 310 remain vertical, even when the conductive silicon parts 310 contact and are pressed by the ball leads 170 and/or the test terminals 150.

The silicon rubber of the insulating silicon part 330 may be replaced with polybutadiene, natural rubber, polyisoprene, diene type rubber such as styrene-butadiene rubber, acrylonitrile-butadiene rubber (NBR), or a hydrogen compound of SBR and NBR, a styrene-butadiene block, copolymer, styrene-isoprene block copolymer, block copolymer such as a hydrogen compound of them, chloroprene, urethane rubber, polyethylene rubber, epichlorohydrin rubber, ethylene-proplyene copolymer, ethylene-propylene-diene copolymer, or the like. Here, if the insulating silicon part 330 requires resistance to weathering, the insulating silicon part 330 may be formed of rubber copolymer instead of diene type rubber. However, the insulating silicon part 330 may be formed of silicon rubber in terms of plating capability and an electric characteristic. The silicon rubber may be formed by its cross-link or condensation. Liquid silicon rubber may have viscosity with a recovery ratio less than or equal to a range between 10-1 sec and 105 g/cm·s and may be a condensation type, an addition type, a vinyl group type, or a hydrogen group including type.

A film 340 adheres onto a lower surface of the silicon contactor 300 and includes areas which are open and opposite to the conductive silicon parts 310. The film 340 prevents the conductive powders 312 from being included in the insulating silicon part 330 to prevent the conductive silicon parts 310 from being electrically connected to one another. The film 340 also prevents the conductive silicon parts 310 from contacting the test terminals 150 that the conductive silicon parts 310 must not contact. The film 340 may be formed of a plastic synthetic resin having high electricity or a polyimide material.

The film 340 adheres onto the lower surface of the silicon contactor 330, i.e., to the semiconductor testing device 40, in FIG. 3, but a film 340 may further adhere onto an upper surface of the silicon contactor 300.

Figure 4:
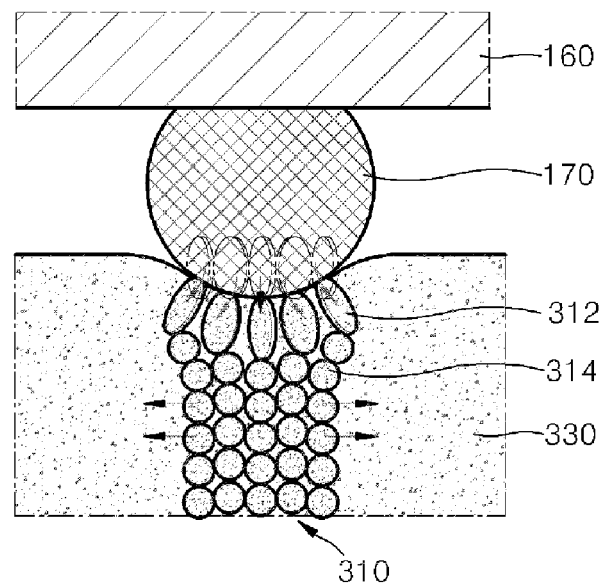
FIG. 4 is a cross-sectional view illustrating a contact state between a silicon contactor and ball leads of a semiconductor device, according to an embodiment of the present invention.

FIG. 4 is a cross-sectional view illustrating a contact state between the silicon contactor 300 and the ball lead 170 of the semiconductor device 160, according to an embodiment of the present invention.

As shown in FIG. 4, the ball lead 170 of the semiconductor device 160 contacts the conductive silicon part 310 so as to test the semiconductor device 160. The conductive silicon part 310 is pressed by the ball lead 170, and the plate type powders 312 move from their original positions (marked with dotted lines) to lower positions due to elasticity of the silicon rubbers included in the conductive silicon part 310 and the insulating silicon part 330. The conductive silicon part 310 contacts the ball lead 170 of the semiconductor device 160 in FIG. 4 and may contact the test terminal 150 of the semiconductor testing device 140 using the same method as contacting the ball leads 170.

As described above, the plate type powders 312 come into the line-contacts with the ball leads 170 and thus improve the contact pressures more than the conventional ball type powders 120.

When the plate type powders 312 are pressed by the ball leads 170, the plate type powders 312 rotate due to an effect of momentum (not shown) and move downward due to an effect of momentum. When the plate type powders 312 move downward with rotating, the plate type powders 312 may scratch the ball leads 170, thereby removing an oxide layer and foreign substances remaining on surfaces of the ball leads 170.

Figure 5:
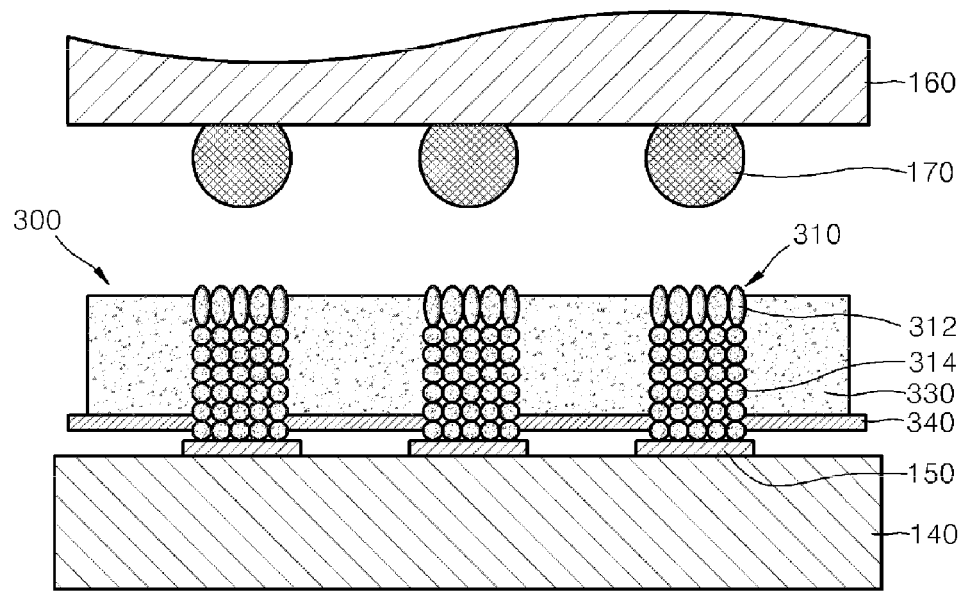
FIG. 5 is a cross-sectional view illustrating a silicon contactor according to another embodiment of the present invention.
Figure 6:
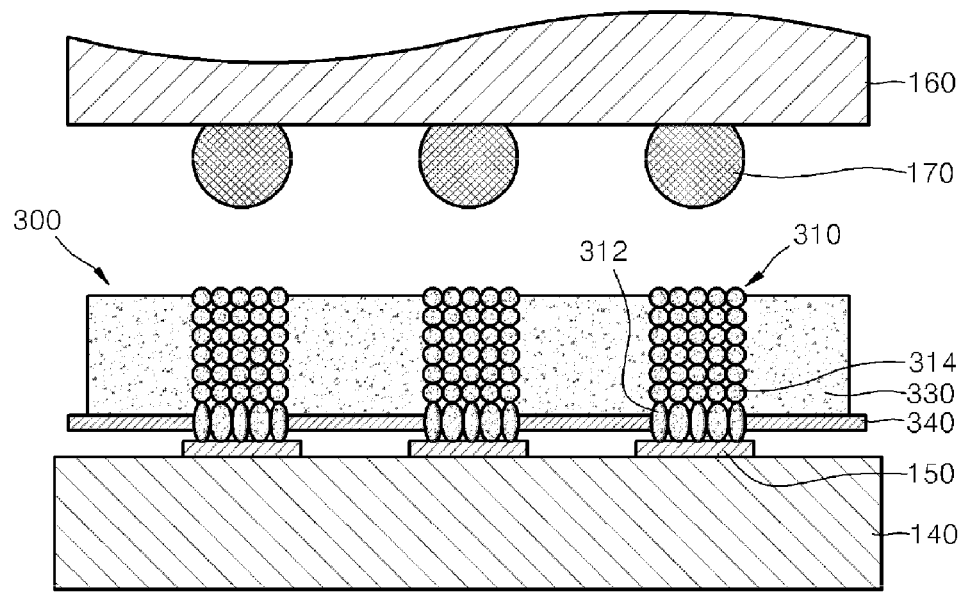
FIG. 6 is a cross-sectional view illustrating a silicon contactor according to another embodiment of the present invention.
Figure 7:
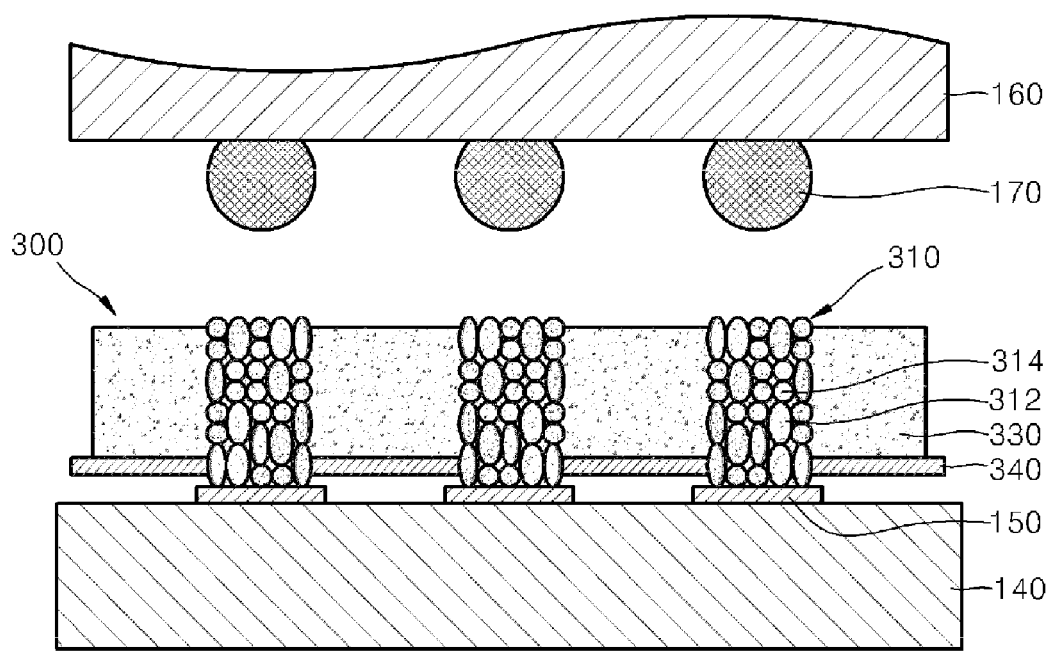
FIG. 7 is a cross-sectional view illustrating a silicon contactor according to another embodiment of the present invention.

FIG. 5 is a cross-sectional view illustrating a silicon contactor 300 according to another embodiment of the present invention. FIG. 6 is a cross-sectional view illustrating a silicon contactor 300 according to another embodiment of the present invention. FIG. 7 is a cross-sectional view illustrating a silicon contactor 300 according to another embodiment of the present invention;

Like a conventional silicon contactor, the silicon contactor 300 of FIG. 5 uses ball type powders 314 as conductive powders of conductive silicon parts 310. However, the silicon contactor 300 further uses plate type powders 312 which are erect in areas of the conductive silicon parts 310 which contact ball leads 170 of the semiconductor device 160.

The silicon contactor 300 of FIG. 6 also uses ball type powders 314 as conductive powders of conductive silicon parts 310, like the conventional silicon contactor. However, the silicon contactor 300 further uses plate type powders 312 which are erect in areas of the conductive silicon parts 310 which contact test terminals 150 of a semiconductor testing device 140.

The silicon contactor 300 of FIG. 7 uses ball type powders 312 and plate type powders 314 as conductive powders of conductive silicon parts 310. The plate type powders 312, which contact ball leads 170 of a semiconductor device 160 and test terminals 150 of a semiconductor testing device 140, are erect.

In the embodiments of FIGS. 5 through 7, a film 340 adheres onto a lower surface of the silicon contactor 300. A film 340 may further adhere onto an upper surface of the silicon contactor 300. In the embodiments of FIGS. 5 through 7, parts of bodies of conductive powders, which contact the ball leads 170 and/or the test terminals 150, may be exposed outside silicon rubber.

According to an embodiment of the present invention, conductive powders may be variously arranged in the silicon parts 310 of the silicon contactor 300 as in the embodiments of FIGS. 5 through 7. However, the arrangement of the conductive powders in the conductive silicon parts 310 is not limited to the embodiments of FIGS. 5 through 7. For example, as shown in FIG. 3, only the plate type powders 312 may be arranged as conductive powders. The ball type powders 314 and the plate type powders 312 may be mixed in the conductive silicon parts 310, but only the plate type powders 312 may contact the ball leads 170 and/or the test terminals 150. The ball type powders 314 and the plate type powders 312 may be arranged in the conductive silicon parts 310, but only the plate type powders 312 may contact the ball leads 170 and/or the test terminals 150. As long as the plate type powders 312 are arranged in areas of the conductive silicon parts 310, which contact the ball leads 170 and/or the test terminals 150, so as to improve a contact characteristic of the silicon contactor 300 and prevent the plate type powders 312 from easily coming out of the conductive silicon parts 310, the conductive powders of the conductive silicon parts 310 may be arranged in any pattern.

FIGS. 8 through 11 are respectively cross-sectional views illustrating silicon contactors 300 according to embodiments of the present invention.

Referring to FIGS. 8 through 11, only plate type powders 312 are shown as conductive powders but are not limited thereto. As described above, plate type powders and ball type powders may be mixed in conductive silicon parts. Alternatively, ball type powders may be arranged in middle areas of the conductive silicon parts, and plate type powders may be erect only in areas of the conductive silicon parts contacting the test terminals 150 and/or the ball leads 170. In other words, plate type powders and ball type powders may be arranged using various methods. A film 340 adheres onto a lower surface of the silicon contactor 300 as shown in FIGS. 3 through 7, but a film 340 may further adhere onto an upper surface of the silicon contactor 300.

Figure 8:
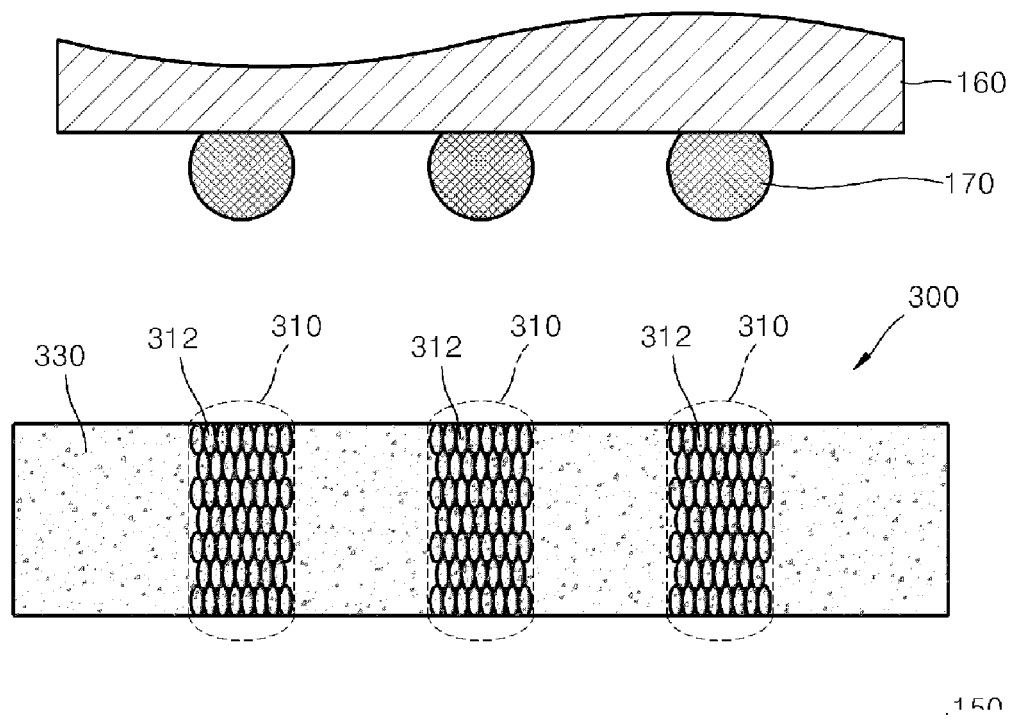
FIG. 8 is a cross-sectional view illustrating a silicon contactor according to another embodiment of the present invention.

In the silicon contactor 300 of FIG. 8, an insulating silicon part 330 has the same thickness as conductive silicon parts 310. Conductive powders 312 are densely filled into silicon rubber to form the conductive silicon parts 310 which conducts electricity. When seeing sideways the silicon contactor 300, the insulating silicon part 330 has the same height as the conductive silicon parts 310, and thus the silicon contactor 300 is seen as being flat.

Figure 9:
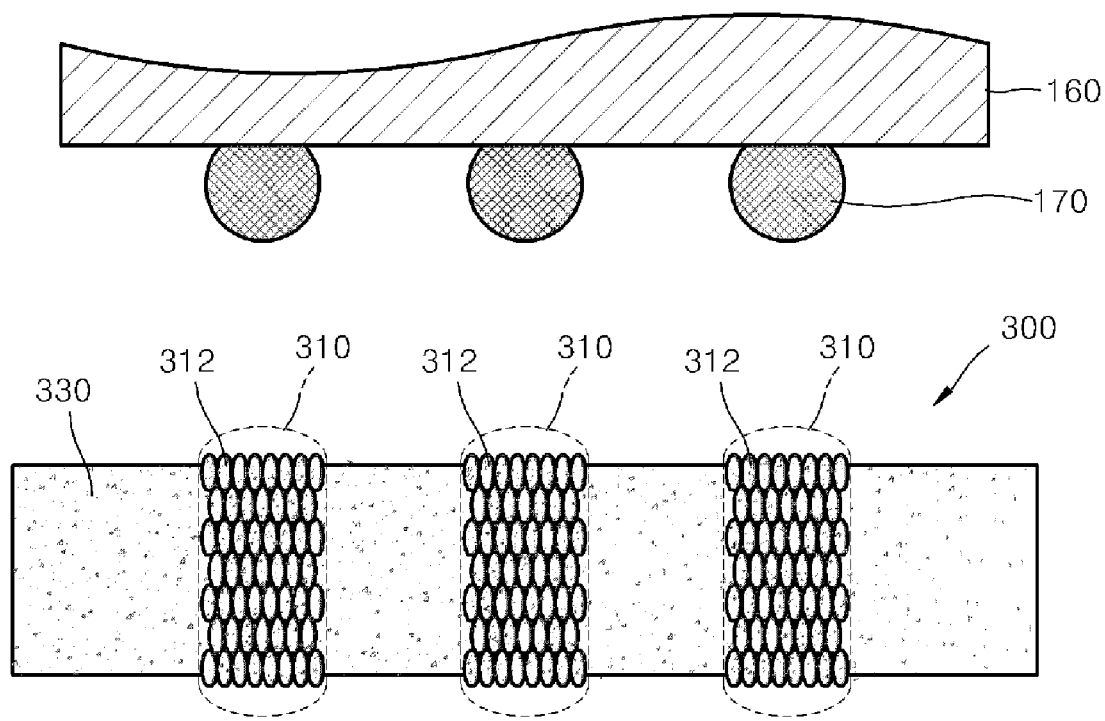
FIG. 9 is a cross-sectional view illustrating a silicon contactor according to another embodiment of the present invention.

In the silicon contactor 300 of FIG. 9, parts of bodies of conductive powders 312 are exposed outside the silicon rubber. The ball leads 170 and/or the test terminals 150 do not directly contact the silicon rubber to prevent the silicon rubber from being damaged. Since the conductive powders 312 directly contact the ball leads 170 and/or the test terminals 150, a contact characteristic is improved, and the silicon rubber is prevented from being damaged, thereby preventing the conductive powders 312 from easily coming out of the silicon rubber.

Figure 10:
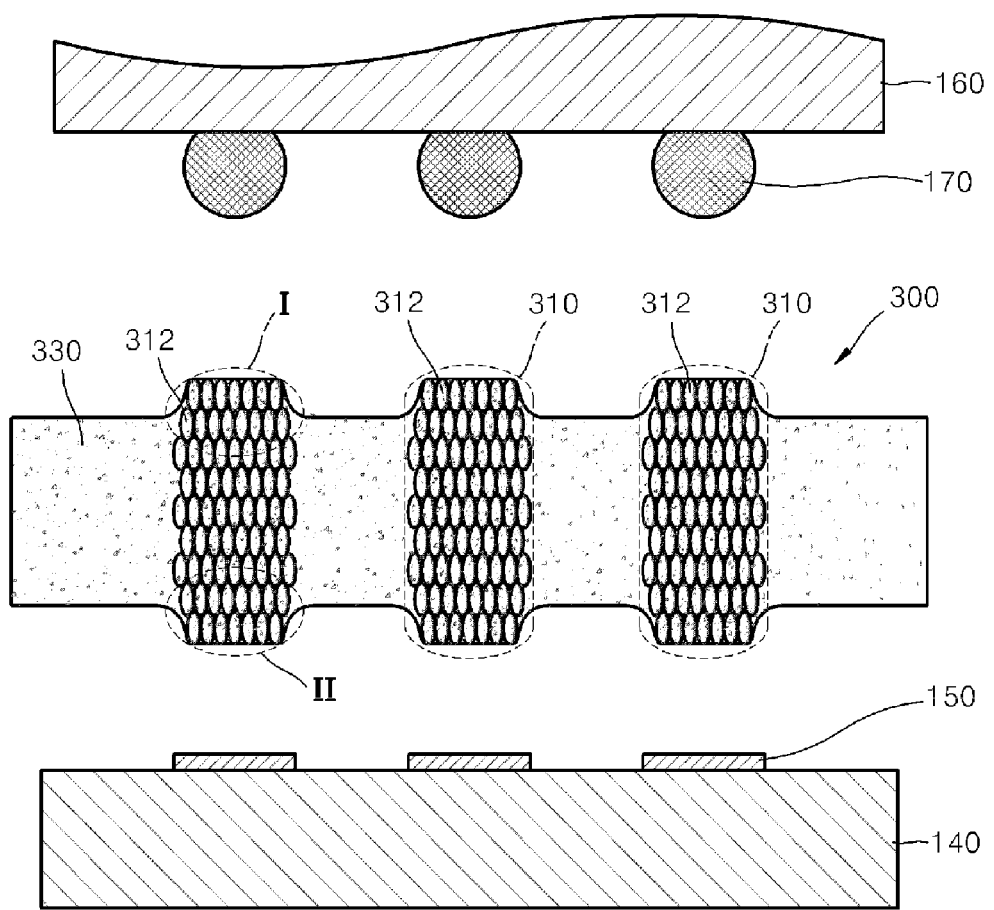
FIG. 10 is a cross-sectional view illustrating a silicon contactor according to another embodiment of the present invention.

In the silicon contactor 300 of FIG. 10, conductive silicon parts 310 protrude more than an insulating silicon part 330. The conductive silicon parts 310 are thicker than the insulating silicon part 330 to protrude more than the insulating silicon part 330 so as to have uneven shapes. Here, protruding heights of the conductive silicon parts 310 may be appropriately determined according to a use purpose and a size of the silicon contactor 300, sizes of the test terminals 150 and/or the ball leads 170, etc. cross-sectional shapes of protruding parts of the conductive silicon parts 310 are not limited to shapes shown in FIG. 10 but may have various uneven shapes (e.g., rectangular, trapezoidal, and hemispherical shapes, etc.). Parts I of the conductive silicon parts 310 contacting the ball leads 170 and/or parts II of the conductive silicon parts 310 contacting the test terminals 150 protrude in uneven shapes. Thus, a contact characteristic between the silicon contactor 300 and the ball leads 170 and/or a contact characteristic between the silicon contactor 300 and the test terminals 150 are improved.

Figure 11:
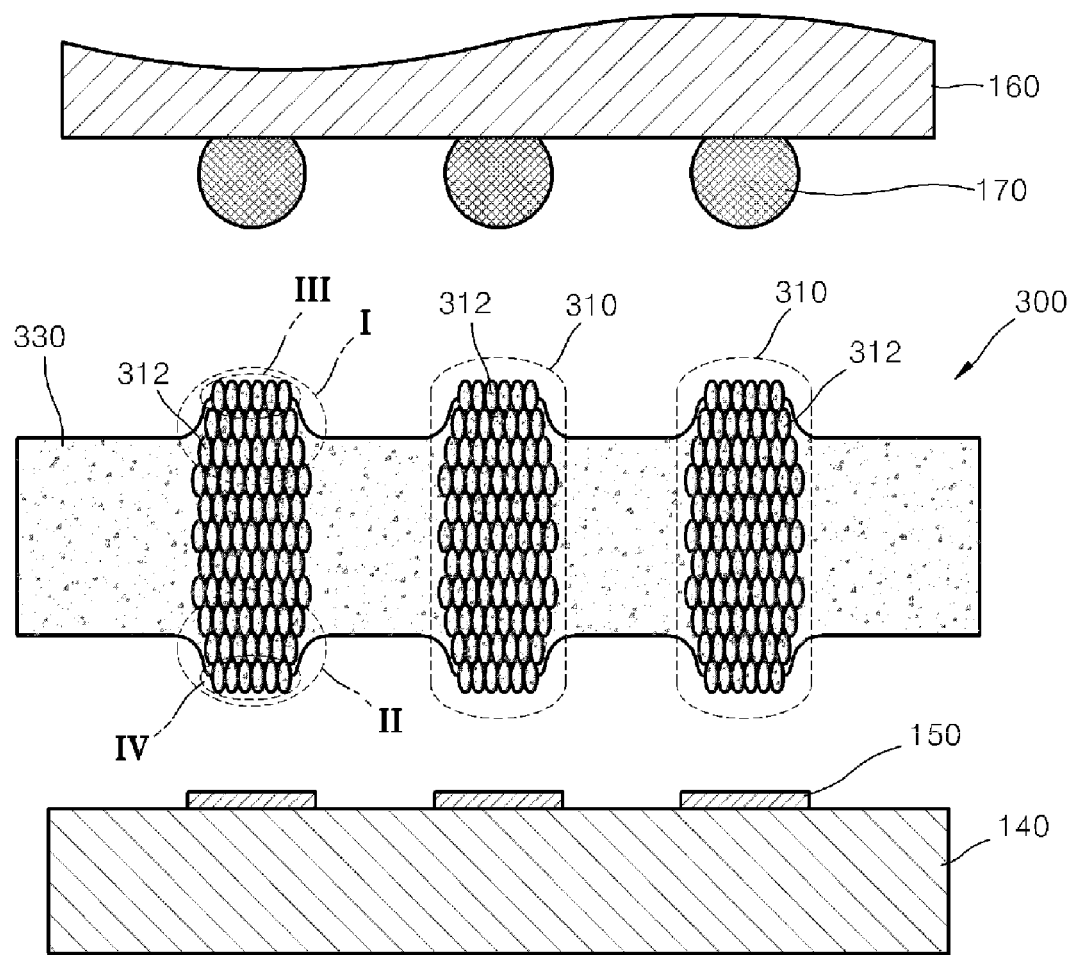
FIG. 11 is a cross-sectional view illustrating a silicon contactor according to another embodiment of the present invention.

In the silicon contactor 300 of FIG. 11, parts of bodies of conductive powders 312 are exposed outside silicon rubber. Parts I and II of the conductive silicon part 310 contacting the ball leads 170 and/or the test terminals 150 protrude in uneven shapes. Parts III and IV of bodies of the conductive powders 312 contacting the ball leads 170 and/or the test terminals 150 are exposed outside the silicon rubber. Since the parts of the bodies of the conductive powders 312 are exposed outside the silicon rubber as described above, the silicon rubber is prevented from being damaged. Also, contact characteristics between the silicon contactor 300 and the ball leads 170 and/or the test terminals 150 are improved, and the conductive powders 312 are prevented from easily coming out of the silicon rubber.

As described above, according to the present invention, plate type powders are used as conductive powders of conductive silicon parts to improve contact characteristics between the conductive silicon parts and a semiconductor device. Also, since contact areas between the plate type powders and silicon rubber are wide, the plate powders do not easily come out of the silicon rubber even when the plate type powders repeatedly contact ball leads of the semiconductor device or test terminals of a semiconductor testing device. In addition, when the plate type powders contact the ball leads of the semiconductor device and/or the test terminals of the semiconductor testing device, oxide layers and foreign substances remaining on surfaces of the ball leads and/or the test terminals are removed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silicon contactor of which a side contacts test terminals of a semiconductor testing device and of which an other side contacts ball leads of a semiconductor device so as to be used in the semiconductor testing device, comprising:
    conductive silicon parts which are formed opposite to the ball leads and/or the test terminals and comprise silicon rubber and conductive powders; and
    an insulating silicon part which is formed by filling silicon rubber among areas of the conductive silicon parts, which do not contact the ball leads, and supports the conductive silicon parts,
    wherein the conductive powders of the conductive silicon parts comprise plate type powders, and
    wherein circumferential surfaces of the plate type powders are erect to contact the ball leads or the test terminals.

2. The silicon contactor of claim 1, wherein each of wide surfaces of the plate type powders has at least one of a circular shape, an elliptical shape, and a polygonal shape.

3. The silicon contactor of claim 1, wherein the conductive powders further comprise ball type powders.

4. The silicon contactor of claim 1, wherein the conductive silicon parts protrude from the insulating silicon part.

5. The silicon contactor of any one of claims 1, 2, 3, and 4, wherein parts of bodies of the conductive powders contacting the ball leads are exposed outside the silicon rubber.

6. The silicon contactor of any one of claims 1, 2, 3, and 4, wherein parts of bodies of the conductive powders contacting the test terminals are exposed outside the silicon rubber.

* * * * *